United States Patent [19]

Suzuki

[11] Patent Number: 5,410,312
[45] Date of Patent: Apr. 25, 1995

[54] DIGITAL/ANALOG CONVERSION DEVICE WITH TWO SWITCHED LATCHES FOR SIMULTANEOUS D/A CONVERSION

[75] Inventor: Shinichi Suzuki, Hyougo, Japan

[73] Assignee: Mitsubishi Denki Kabushiki Kaisha, Tokyo, Japan

[21] Appl. No.: 112,400

[22] Filed: Jul. 30, 1993

[30] Foreign Application Priority Data

Aug. 3, 1992 [JP] Japan ............... 4-226375

[51] Int. Cl.⁶ .............................. H03M 1/66
[52] U.S. Cl. .......................... 341/144; 341/118
[58] Field of Search ...................... 341/118, 144

[56] References Cited

U.S. PATENT DOCUMENTS 4,308,585  12/1981  Jordan ................... 364/520
4,998,107  3/1991  Suzuki ................... 341/144

Primary Examiner—Marc S. Hoff
Attorney, Agent, or Firm—Townsend and Townsend Khourie and Crew

[57] ABSTRACT

Since the D/A conversion device comprises first registers (DA-1) 3a and (DA-2) 3b for latching a plurality of digital value data from the central processing unit among which there is a time lag, the switch circuits 6a and 6b are made conductive by the signal CPUS based on an address specified by the central processing unit so that the digital value data latched by the first registers (DA-1) 3a and (DA2) 3b are written onto the conversion registers (DA-1) 4a and (DA-2) 4b simultaneously and converted into analog voltages by the resistance ladders (DA-1) 7a and (DA-2) 7b. In this way, a plurality of D/A conversion outputs become simultaneous.

8 Claims, 10 Drawing Sheets

FIG.10 (A) PRIOR ART
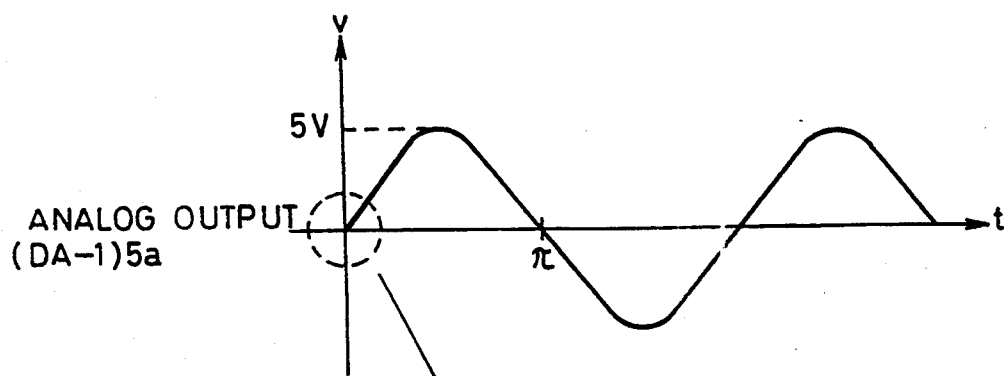
FIG.10 (B) PRIOR ART
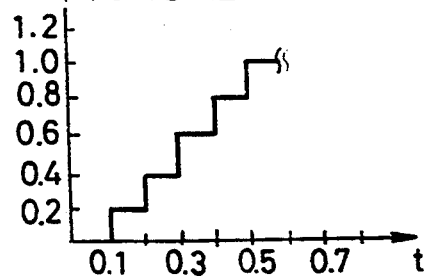
FIG.10 (C) PRIOR ART
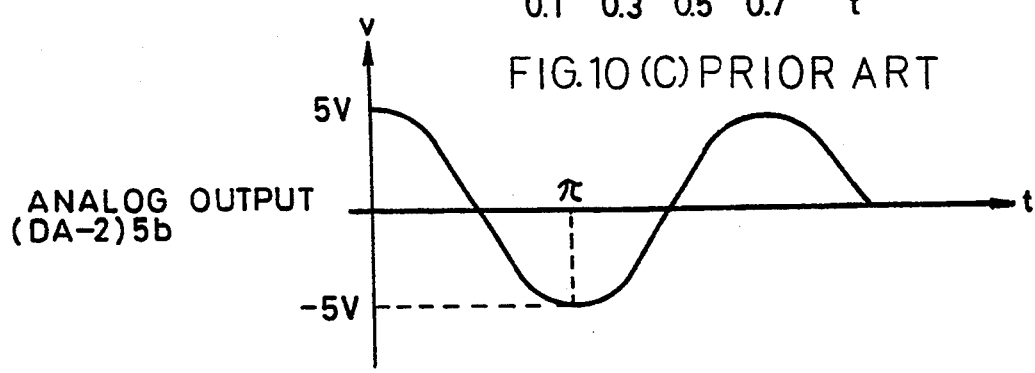

DIGITAL/ANALOG CONVERSION DEVICE WITH TWO SWITCHED LATCHES FOR SIMULTANEOUS D/A CONVERSION

BACKGROUND OF THE INVENTION

1. Field of the Invention

The present invention relates to a microcomputer and, more particularly, to a digital/analog conversion device (referred to as "D/A conversion device" hereinafter) incorporated in a microcomputer which enables simultaneous outputs from a plurality of digital/analog converters (referred to as "D/A converter" hereinafter).

2. Description of the Prior Art

Referring to FIG.9, there is shown a D/A converter incorporated in a conventional microcomputer. FIG.9 is a circuit block diagram in the case of two D/A converters. In the figure, reference numeral 1 represents the data bus of the microcomputer which is connected to an unshown central processing unit. Denoted at 2a and 2b are switch circuits which are made conductive by write signals WRDA1 and WRDA2 from the central processing unit. When these switch circuits are conductive, data over the data bus 1 is written onto conversion registers. The write signals WRDA1 and WRDA2 are supplied from the central processing unit, but these signals are transmitted not simultaneously but independently. Denoted at 4a and 4b are conversion registers (DA-1) and (DA-2), respectively, which latch digital value data read from the data bus 1 with the switch operation of the switch circuits 2a and 2b. Designated at 7a and 7b are resistance ladders (DA-1) and (DA-2), respectively, which are the combinations of a plurality of resistors and switch circuits connected in the ladder configuration and convert the digital value data latched by the conversion registers (DA-1) 4a and (DA-2) 4b into corresponding analog voltages. Designated at 5a and 5b are analog voltage output terminals which output analog voltages converted by their respective resistance ladders (DA-1) 3a and (DA-2) 3b to external circuits.

A description is subsequently given of the operation of the prior art. A predetermined analog voltage from one of the two D/A converters shown in FIG.9, for instance, a voltage of 5V from the analog voltage output terminal 5a, is generated in the following manner. The switch circuit 2a is first made conductive by an address value indicative of the position of the switch circuit 2a, that is, the write signal WRDA1 from the unshown central processing unit, so that digital value data "OOXXH" (expressed in hexadecimal notation) corresponding to the analog voltage of 5 V is written onto the conversion register (DA-1) 4a through the data bus 1. Now, the digital value data written onto the conversion register (DA-1) 3a is latched until the next digital value data is written. The digital value data "OOXXH" written onto the conversion register (DA-1) 3a is converted into a corresponding analog voltage of 5V by the resistance ladder (DA-1) 7a and the analog voltage is output to the external circuit from the analog voltage output terminal 5a. The process of outputting a predetermined analog voltage from the analog voltage output terminal 5b is the same as described above, but it is completely independent from the process for the analog voltage output terminal 5a. FIG. 10(A) shows the sine wave of an analog voltage signal output from the D/A converter of this prior art, that is, a signal output from the analog voltage output terminal (DA-1) 5a. Actually, the sine wave has a stepped waveform with a maximum amplitude of 5V in increments of 0.2V at time intervals of 0.1 ms as shown in FIG. 10(B). FIG. 10(C) shows a signal output from the analog voltage output terminal (DA-2) 5b and is different from the sine wave of FIG. 10(A) by a phase of $\pi/2$.

Since the D/A converter incorporated in the microcomputer of the prior art is structured as described above, the digital value data latched by the conversion registers (DA-1) 4a and (DA-2) 4b included in the respective D/A converters cannot be changed simultaneously. As described above, since there is a time lag in the alteration of data stored in the two registers, it is impossible to change output voltage signals output from the analog voltage output terminals 5a and 5b simultaneously. For instance, to output the sine waves as shown in FIGS. 10(A) and (C), both the hardware and software for controlling the phase difference between these waves must be extremely complex. The problem of phase difference can even be fatal in such a complex system where the sine wave is used as a reference voltage wave for controlling an inverter circuit for the control of a motor.

The present invention is intended to solve the above-mentioned problem, and it is therefore an object of the invention to provide a D/A conversion device in which output voltage signals from the analog voltage output terminals of a plurality of D/A converters can be changed by a central processing unit simultaneously.

SUMMARY OF THE INVENTION

As shown in FIG. 1, according to the first aspect of the invention as claimed in claim 1, there is provided a D/A conversion device which comprises at least a plurality of first switch circuits (2a, 2b) which, each time an address value is specified by the central processing unit, make conductive switches corresponding to the address value to pass digital value data indicative of an address from the bus, and first latch means (conversion registers (DA-1) 4a, (DA-2) 4b) corresponding to the first switch circuits for temporarily latching the digital value data before conversion into analog voltages. The D/A conversion device further comprises second latch means (first register (DA-1) 3a, (DA-2) 3b) for latching the digital value data read from the data bus through the respective switches of the first switch circuits which are made conductive by an address value specified by the central processing unit, and second switch circuits (6a, 6b) which, when a predetermined address value is specified by the central processing unit, make conductive all of their switches simultaneously to write all the digital value data latched by the second latch means onto the first latch means.

As shown in FIG.3, according to the second aspect of the invention as claimed in claim 6, there is provided a D/A conversion device which comprises at least a plurality of first switch circuits (2a, 2b) which, each time an address value is specified by the central processing unit, make conductive switches corresponding to the address value to pass digital value data from the bus, and first latch means (conversion registers (DA-1) 4a, (DA-2) 4b) corresponding to the first switch circuits for temporarily latching the digital value data before conversion into analog voltages. The D/A conversion device further comprises second latch means (first register (DA-1) 3a, (DA-2) 3b) for latching the digital value data read from the data bus through the respective switches of the first switch circuits which are made conductive by an address value specified by the central processing unit, a timer circuit 30 which outputs an overflow signal at predetermined time intervals, and second switch circuits (6a, 6b) which make all of their switches conductive simultaneously upon reception of the overflow signal from the timer circuit to write all the digital value data latched by the second latch means onto the first latch means.

As shown in FIG. 5, according to the third aspect of the invention as claimed in claim 8, there is provided a D/A conversion device which comprises at least a plurality of first switch circuits (2a, 2b) which, each time an address value is specified by the central processing unit, make conductive switches corresponding to the address value to pass digital value data from the bus, and first latch means (conversion registers (DA-1) 4a, (DA-2) 4b) corresponding to the first switch circuits for temporarily latching the digital value data before conversion into analog voltages. The D/A conversion device further comprises second latch means (first register (DA-1) 3a, (DA-2) 3b) for latching the digital value data read from the data bus through the respective switches of the first switch circuits which are made conductive by an address value specified by the central processing unit, an edge detection circuit 41 for detecting an edge from a rise or fall in the pulse signal input from the external circuit, and second switch circuits (6a, 6b) which make all of their switches conductive simultaneously upon reception of the signal based on the edge detected by the edge detection circuit to write all the digital value data latched by the second latch means onto the first latch means.

In the D/A conversion device according to the first aspect of the invention, the central processing unit first supplies an address value indicative of the positions of switch circuits and digital value data corresponding to this address value one after another. A plurality of first switch circuits corresponding to the address value become conductive so that the corresponding digital value data from the bus are latched by the respective second latch means (first register (DA-1) 3a, (DA-2) 3b). Thereafter, the central processing unit outputs a predetermined address value. A signal based on this address value is input into the second switch circuits (6a, 6b) simultaneously so that the second switch circuits become conductive simultaneously. As a result, the digital value data latched by the second latch means are input into and latched by the first latch means simultaneously and converted into corresponding analog voltages. The converted analog voltages are then output. In this way, the second switch circuits become conductive simultaneously, thereby making it possible to change outputs of a plurality of D/A converters simultaneously.

In the D/A conversion device according to the second aspect of the invention, the central processing unit first outputs an address value indicative of the specific positions of a plurality of switch circuits and digital value data corresponding to this address value one after another. The first switch circuits corresponding to the address value become conductive so that digital value data from the bus are latched by the second latch means (first registers (DA-1) 3a, (DA-2) 3b) corresponding to the first switch circuits. Thereafter, the timer circuit 30 outputs an overflow signal each time a timer start signal is input. When the second switch circuits (6a, 6b) receive the overflow signal from the timer circuit, they make all of their switches conductive simultaneously. As a result, all the digital value data latched by the second latch means are input and latched by the first latch means simultaneously and converted into corresponding analog voltages. The converted analog voltages are then output. In this way, the second switch circuits become conductive simultaneously, thereby making it possible to change outputs of a plurality of D/A converters simultaneously.

In the D/A conversion device according to the third aspect of the invention, the central processing unit first outputs an address value indicative of the specific positions of a plurality of switch circuits and digital value data corresponding to this address value one after another. The first switch circuits corresponding to the address value become conductive so that digital value data from the bus are latched by the second latch means (first registers (DA-1) 3a, (DA-2) 3b) corresponding to the first switch circuits. Thereafter, a pulse signal from the external circuit is input into the edge detection circuit 41 which in turn detects an edge from a rise or fall in the pulse signal. The second switch circuits are made conductive simultaneously by a signal based on the detected edge. The operation thereafter is the same as in the first and second aspects of the invention.

The above and other objects, features and advantages of the invention will be more apparent from the following description when taken in conjunction with the accompanying drawings.

BRIEF DESCRIPTION OF THE DRAWINGS

FIG. 10(a) 10(b) and , 10(c) are diagrams illustrating output waveforms when the circuit of FIG.9 is used.

DESCRIPTION OF THE PREFERRED EMBODIMENT

Embodiment 1

Figure 1:
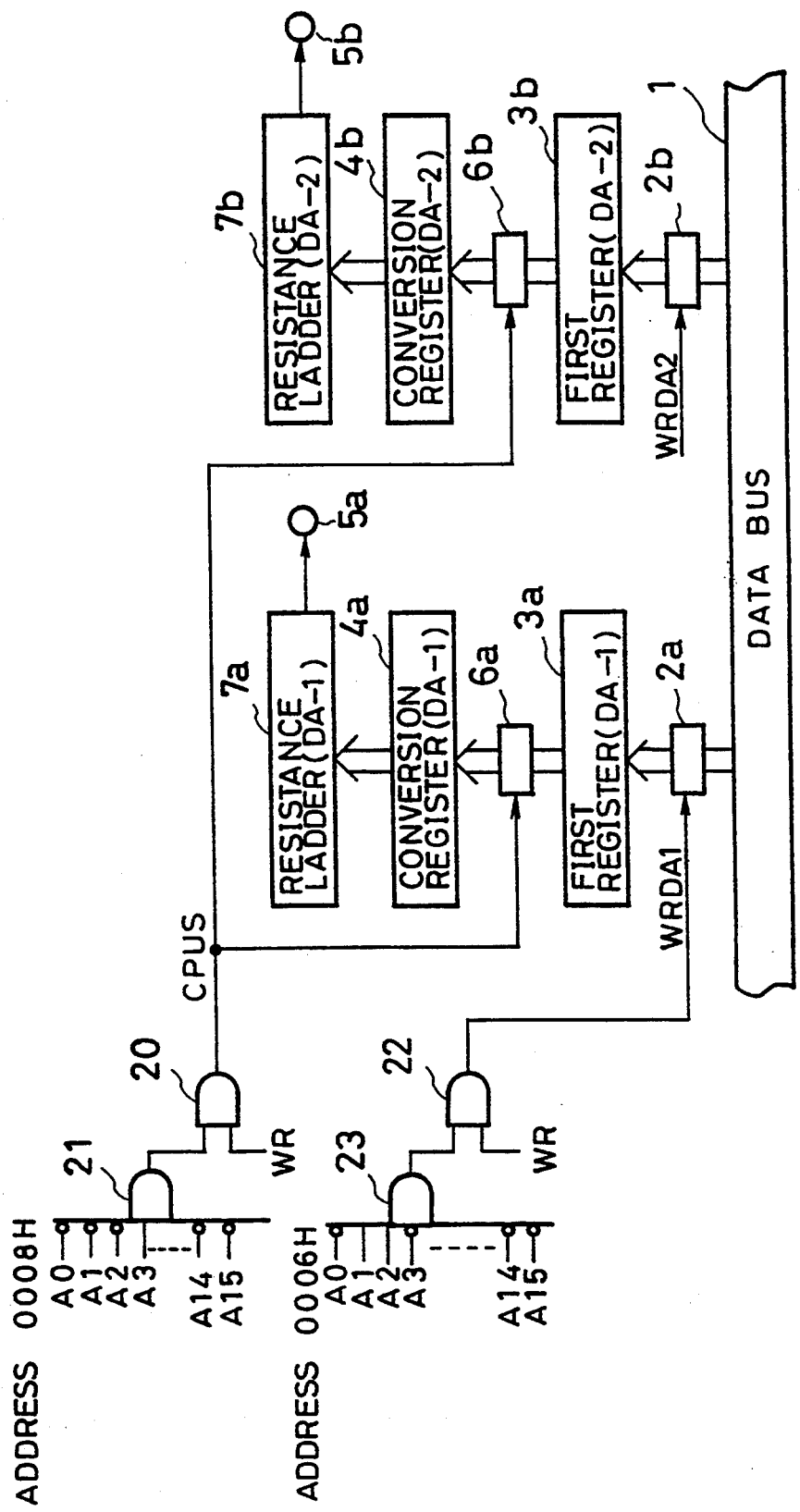
FIG. 1 is a circuit block diagram of a D/A conversion device according to an embodiment of the first aspect of the invention.

A preferred embodiment of the present invention will be described hereunder with reference to the accompanying drawings. FIG. 1 is a circuit block diagram of a D/A conversion device according to an embodiment of the first aspect of the invention. In the figure, denoted at 1 is the data bus of a microcomputer connected to an unshown central processing unit. Denoted at 2a and 2b are switch circuits which are made conductive by write signals WRDA1 and WRDA2 from the central processing unit. When these switch circuits are conductive, digital value data over the data bus is written. Designated at 3a and 3b are first registers (DA-1) and (DA-2) as second latch means for reading digital value data from the data bus 1 through the switch circuits 2a and 2b which become conductive upon reception of address values from the central processing units, that is, the write signals WRDA1 and WRDA2, and for latching the data. Designated at 6a and 6b are switch circuits which are made conductive by a signal CPUS based on a predetermined address value (for example, address "0008H") specified by the central processing unit. The switch circuits 6a and 6b become conductive simultaneously. The conversion registers (DA-1) 4a and (DA-2) 4b temporarily latch the digital value data input from the first registers (DA-1) 3a and (DA-2) 3b, respectively, through the switch circuits 6a and 6b. Designated at 7a and 7b are resistance ladder circuits which convert the digital value data stored in their respective conversion registers (DA-1) 4a and (DA-2) 4b into corresponding analog voltages. Denoted at 5a and 5b are analog voltage output terminals for outputting these analog voltages and denoted at 20 to 23 are logic elements. Since components 1, 2a, 2b, 4a, 4b, 5a, 5b, 7a and 7b have the same functions as the prior art, they are given the same reference codes.

Figure 2:
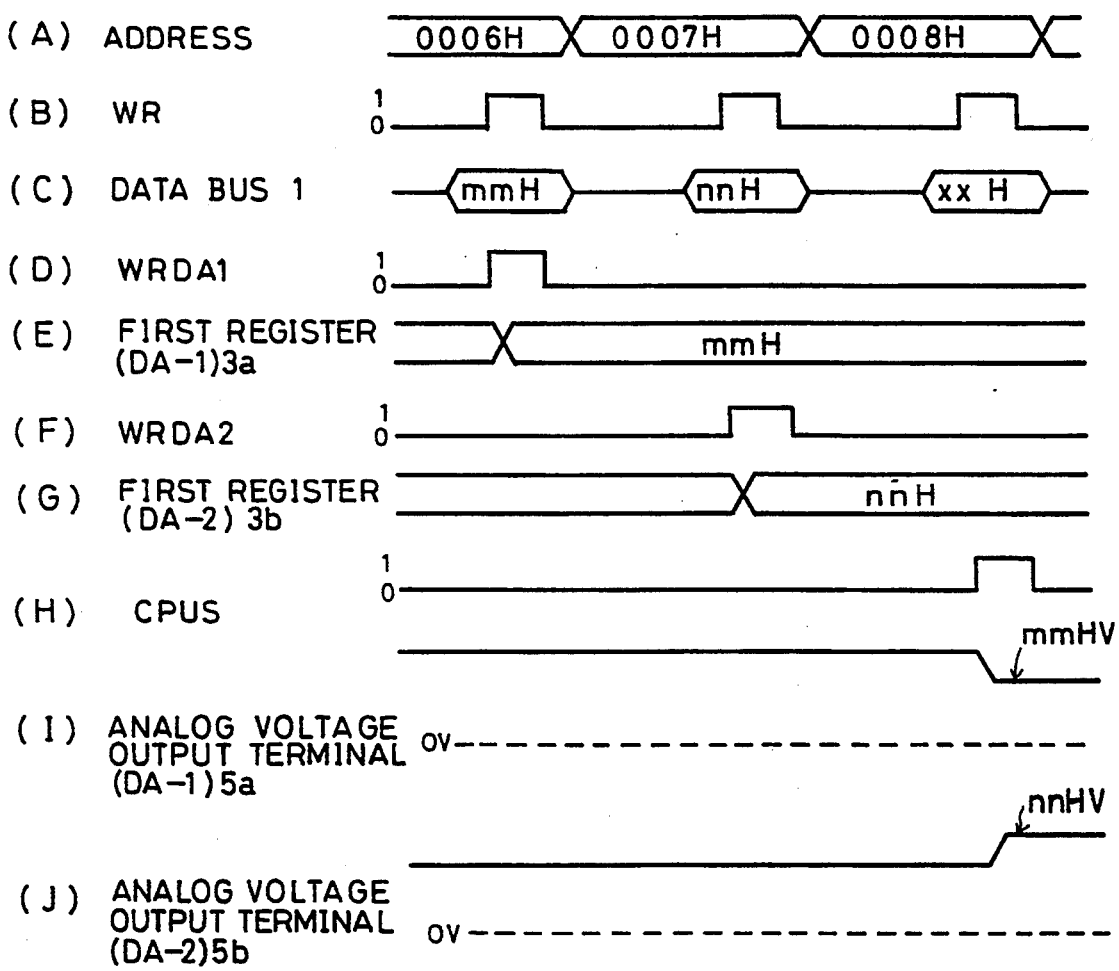
FIG. 2 is a timing chart illustrating the waveform of each part of the circuit of FIG. 1.

A description is subsequently given of the operation of Embodiment 1 with reference to FIG. 2. FIG. 2 is a timing chart illustrating the waveform of each part of the D/A conversion device of FIG. 1. Firstly, suppose that the write signal WRDA1 has been written onto a memory (unshown) at an address "0006H" (expressed in hexadecimal notation), the write signal WRDA2 onto the memory at an address "0007H" and the signal CPUS onto the memory at an address "0008H".

The central processing unit first outputs the address value "0006H" and the write signal WR ((A) and (B) of FIG. 2). At this time, digital value data "mmH" corresponding to the address value "0006H" is output to the data bus 1 ((C) of FIG.2). The address value "0006H" is input into the logic circuit 23 through the bus. The address value, for example, "A0, A1, A2 ... , A15", is expressed as "0, 1, 1, ... , 0" in binary notation. Bits excluding bits A1 and A2 are output with their signals inverted. As a result, the output of the logic circuit 23 is "1", and an AND operation is performed on this output "1" and the write signal WR so as to output the write signal WRDA1 to the switch circuit 2a ((B) and (D) of FIG. 2). Thereby, the switch circuit 2a becomes conductive and the digital value data "mmH" over the bus 1 is input into and latched by the first register (DA-1) 3a ((E) of FIG.2). Thereafter, the central processing unit outputs digital value data "nnH" together with the address value "0007H" and the write signal WR ((A) to (C) of FIG. 2). This address value "0007H" is input into the switch circuit 2b as the write signal WRDA2 by the logic element in the same way as described above ((F) of FIG. 2). Thereby, the switch circuit 2b becomes conductive so that the digital value data "nnH" over the bus 1 is read and latched by the first register (DA-2) 3b ((G) of FIG. 2).

Then, the central processing unit outputs the predetermined address value "0008H" and the write signal WR. At this time, the address value "0008H" is converted into the signal CPUS through the logic elements 21 and 20, and the signal CPUS is input into the switch circuits 6a and 6b at the same time ((H) of FIG. 2). As a result, the switch circuits 6a and 6b become conductive at the same time so that the digital value data "mmH" and "nnH" latched by the first registers (DA-1) 3a and (DA-2) 3b are input into and latched by the conversion registers (DA-1) 4a and (DA-2) 4b, respectively. Thereafter, the digital value data "mmH" is converted into an analog voltage (mmH volts) by the resistance ladder (DA-1) 7a and output from the analog voltage output terminal 5a ((I) of FIG. 2). Similarly, the digital value data "nnH" is converted into an analog voltage (nnH volts) by the resistance ladder (DA-2) 7b and output from the analog voltage output terminal 5b simultaneously with the analog voltage output from the analog voltage output terminal 5a ((J) of FIG. 2).

Embodiment 2

Figure 3:
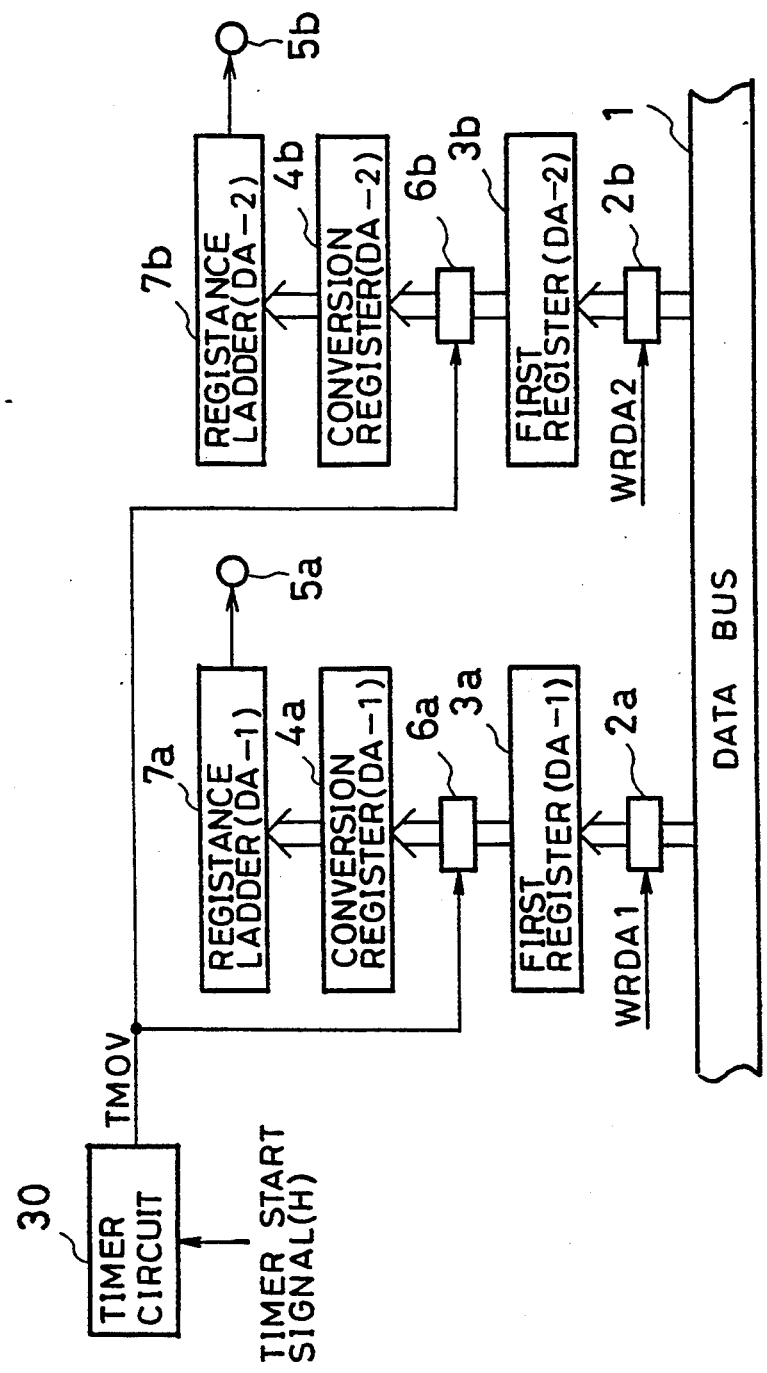
FIG. 3 is a circuit block diagram of a D/A conversion device according to an embodiment of the second aspect of the invention.

FIG. 3 is a circuit block diagram of a D/A conversion device according to an embodiment (Embodiment 2) of the second aspect of the invention as claimed in claim 6. In the figure, reference numeral 30 represents a timer circuit for counting a predetermined time interval. Embodiment 2 differs from Embodiment 1 in that the switch circuits 6a and 6b of Embodiment 2 are connected to the timer circuit 30 and not the bus connected to the central processing unit. The central processing unit supplies a timer start signal to the timer circuit 30 at predetermined time intervals. The timer circuit 30 begins to count with this timer start signal. The waveform of each part of the embodiment at this time is illustrated in the timing chart of FIG. 4.

Figure 4:
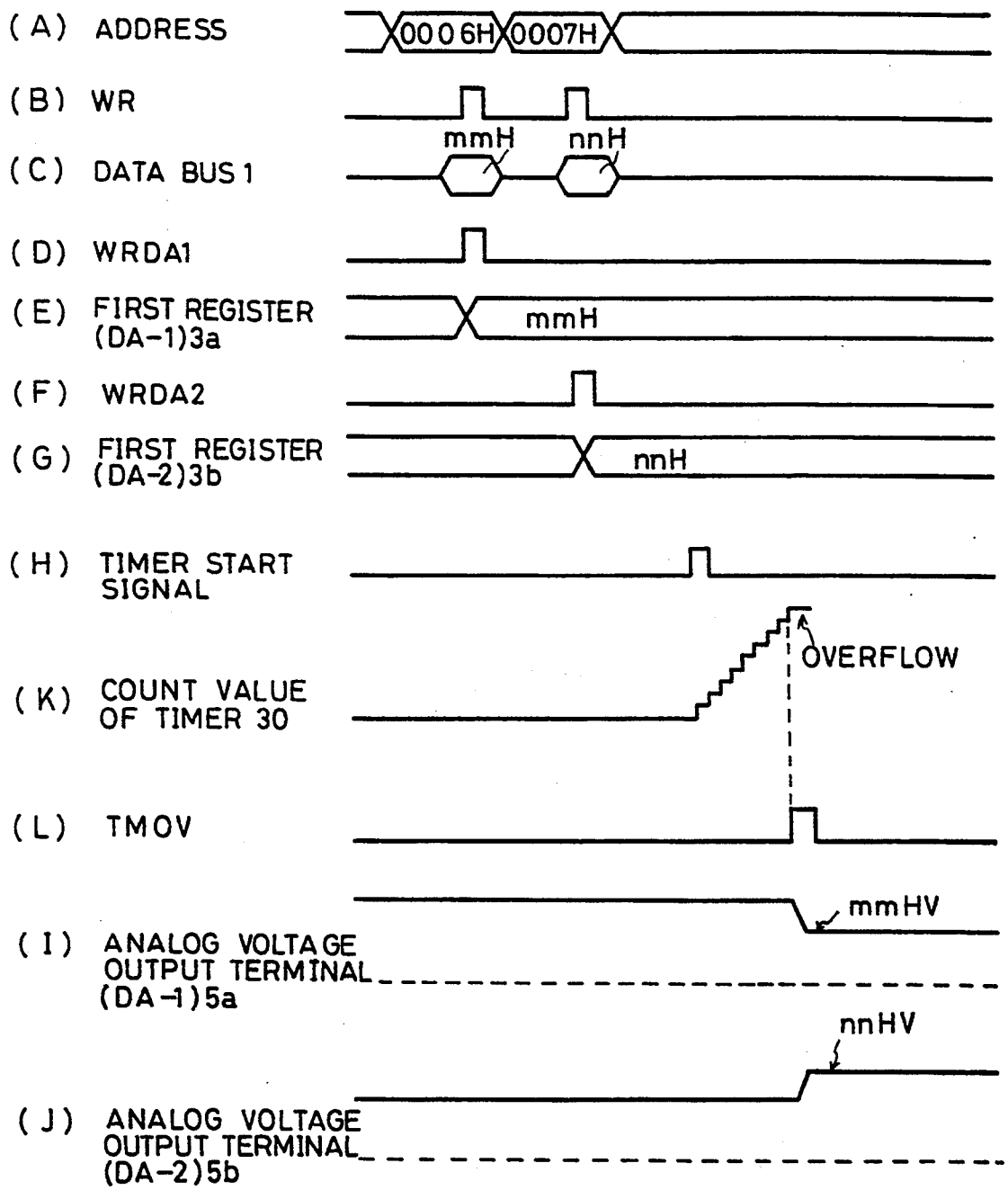
FIG. 4 is a timing chart illustrating the waveform of each part of the circuit of FIG.3.

A description is subsequently given of the operation of Embodiment 2 with reference to FIG. 4. Firstly, the timer circuit 30 begins to count in response to the timer start signal from the central processing unit. When its count value overflows, the timer circuit 30 generates an overflow signal TMOV. In the case of an 8-bit timer, it counts from "00H" to "FFH" and generates the overflow signal TMOV when it counts "00H" again. According to instructions from the central processing unit, the operation of Embodiment 2 is the same as Embodiment 1 until the digital value data "mmH" and "nnH" are latched by the first registers (DA-1) 3a and (DA-2) 3b, and accordingly, its description is omitted ((A) to (G) of FIG. 4). When the central processing unit supplies to the timer start signal to the timer circuit 30, the timer circuit 30 begins to count ((H) and (K) of FIG. 4). When the timer circuit 30 overflows, the overflow signal TMOV becomes "1". The switch circuits 6a and 6b become conductive simultaneously in response to the overflow signal TMOV. As a result, the digital value data "mmH" and "nnH" latched by the first registers (DA-1) 3a and (DA-2) 3b are input into and latched simultaneously by the conversion registers (DA1) 4a and (DA-2) 4b, respectively. The latched digital value data are then converted into corresponding analog voltages by the resistance ladders (DA-1) 7a and (DA-2) 7b and the analog voltages are output simultaneously from the analog output voltage terminals 5a and 5b, respectively ((I) and (J) of FIG. 4).

Embodiment 3

Figure 5:
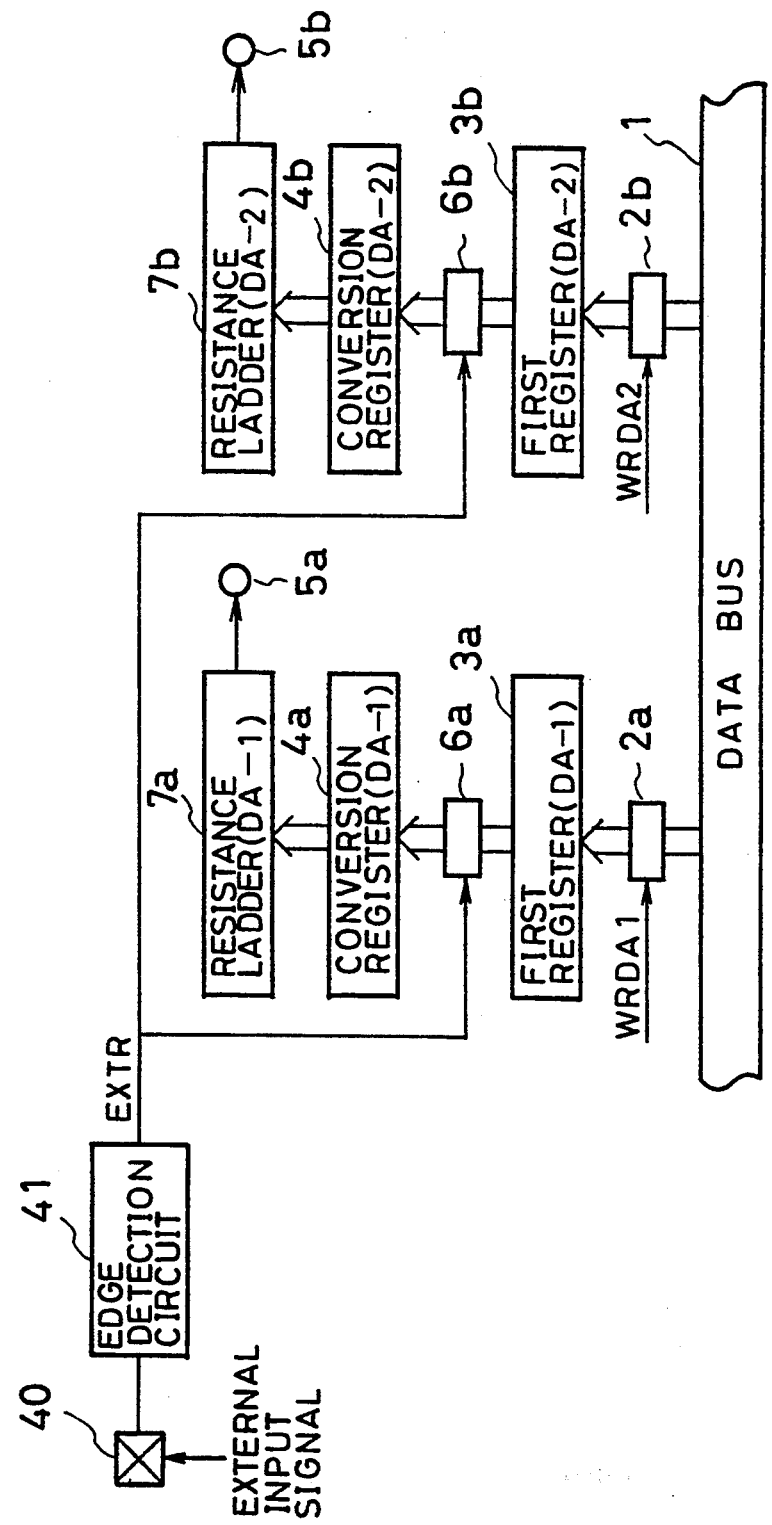
FIG. 5 is a circuit block diagram of a D/A conversion device according to an embodiment of the third aspect of the invention.

FIG. 5 is a circuit block diagram of a D/A conversion device according to an embodiment (Embodiment 3) of the third aspect of the invention. In the figure, reference numeral 40 represents an external input terminal connected to an external circuit for generating a pulse signal, and 41 an edge detection circuit for detecting an edge from a rise or fall in the pulse signal. The external input terminal 40 and the edge detection circuit 41 correspond to the timer circuit of Embodiment 2. In Embodiment 2, the switch circuits 6a and 6b are made conductive simultaneously by the overflow signal of the timer circuit, whereas in Embodiment 3, the external circuit is connected to the external input terminal 40 to generate an external input signal such as a pulse signal whose edge is detected by the edge detection circuit 40. Then, the switch circuits 6a and 6b are made conductive simultaneously by a signal EXTR based on this edge. The waveform of each part of this D/A conversion device is shown in the timing chart of FIG. 6.

Figure 6:
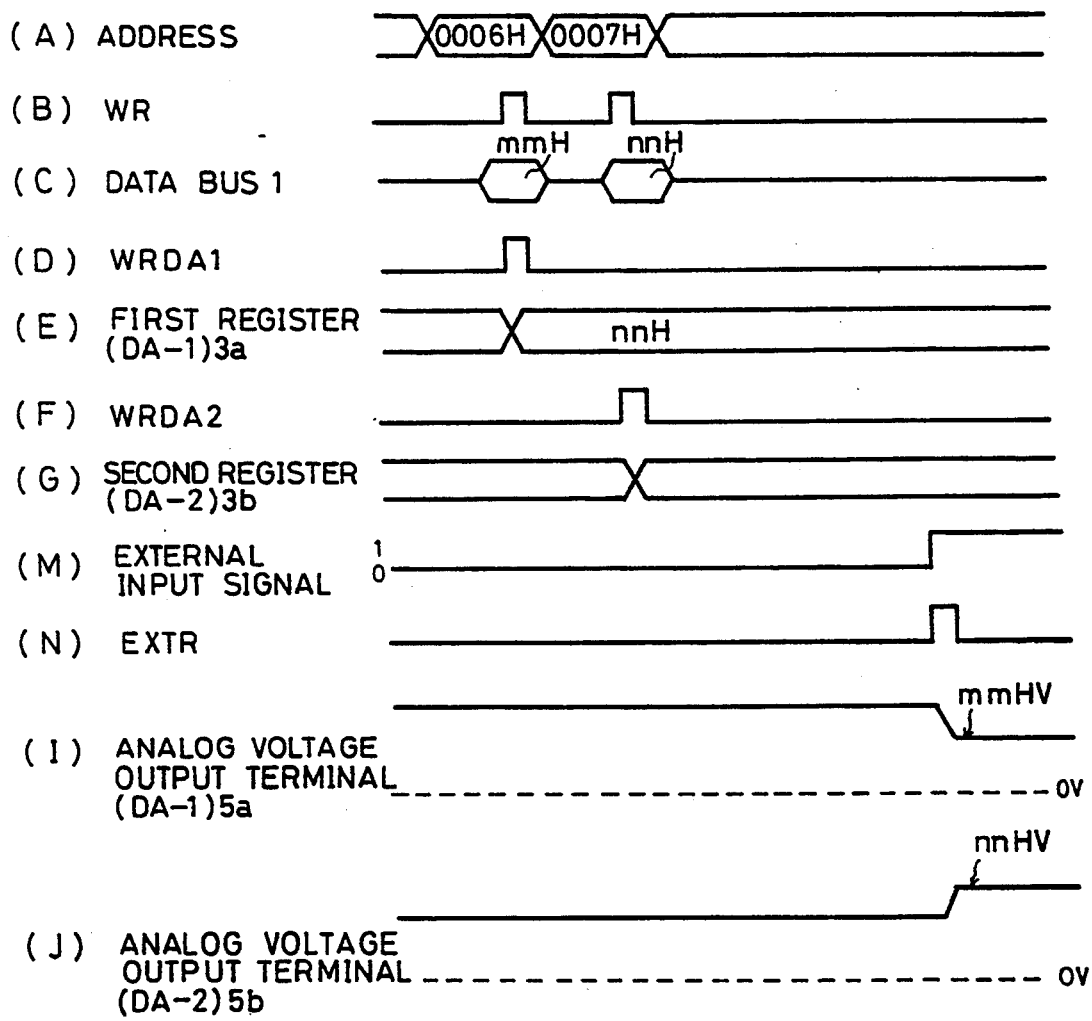
FIG. 6 is a timing chart illustrating the waveform of each part of the circuit of FIG. 5.

A description is subsequently given of the operation of Embodiment 3 with reference to FIG. 6. Firstly, the external input signal from the external circuit connected to the external input terminal 40 is input into the edge detection circuit 41 ((M) of FIG. 6), and when the signal rises from "0" to "1", an edge is detected by the edge detection circuit 41 and the signal EXTR (one-shot pulse) based on this edge is output. The signal EXTR is then input into the switch circuits 6a and 6b. The operation of Embodiment 3 is the same as Embodiments 1 and 2 until the digital value data "mmH" and "nnH" are latched by the first registers (DA-1) 3a and (DA-2) 3b according to instructions from the central processing unit, and its description is therefore omitted ((A) to (G) of FIG. 6). When the external input signal is input from the external circuit ((M) of FIG. 6) and rises from "0" to "1, the edge detection circuit 41 detects an edge, and the signal EXTR based on the edge is input into the switch circuits 6a and 6b simultaneously ((N) of FIG.6). Thereafter, these switch circuits 6a and 6b become conductive simultaneously, whereby the digital value data "mmH" and "nnH" latched by the first registers (DA-1) 3a and (DA-2) 3b are latched by the corresponding conversion registers (DA-1) 4a and (DA-2) 4b and converted into analog voltages by the resistance ladders (DA-1) 7a and (DA-2) 7b, respectively. Thereafter, these analog voltages are output from the analog voltage output terminals 5a and 5b simultaneously.

Embodiment 4

Figure 7:
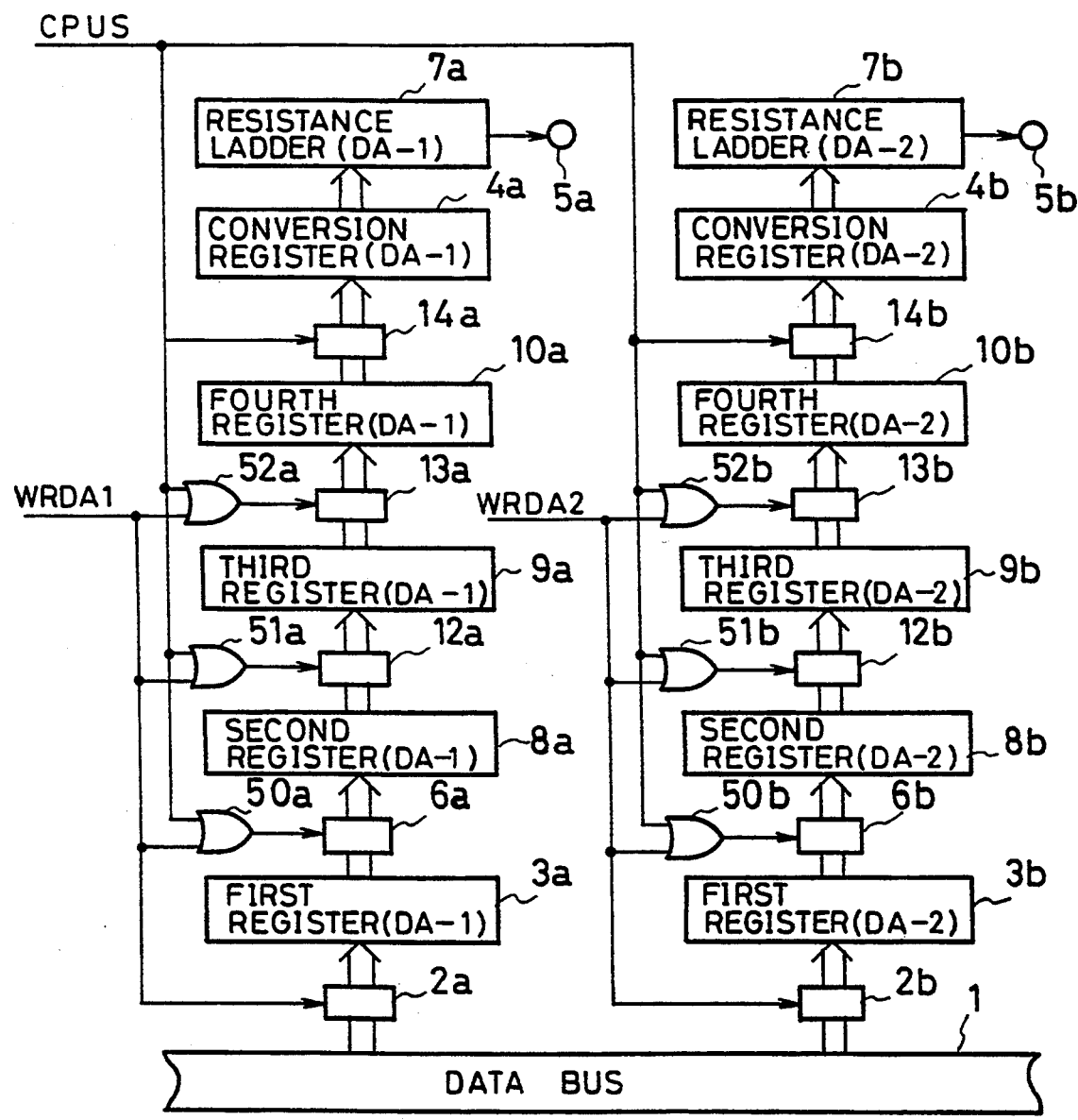
FIG. 7 is a circuit block diagram of a D/A conversion device according to an applied example of the invention.

FIG.7 is a circuit block diagram of an applied example of Embodiment 1. In the figure, denoted at 6a, 6b, 12a, 12b, 13a and 13b are switch circuits which are made conductive by the write signals CPUS, WRDA1 and WRDA2 of FIG. 1. Denoted at 8a and 8b are second registers (DA-1) and (DA-2), 9a and 9b third registers (DA-1) and (DA-2), 10a and 10b fourth registers (DA-1) and (DA-2), 50a to 52a and 50b to 52b logic elements (off elements). This applied example of a D/A converter comprises a plurality of registers (second to fourth registers) connected in series, whereas the D/A converters of Embodiments 1 to 3 comprise only one first register. Each of the registers receives digital value data from the register therebefore and outputs the data to the register thereafter each time the switch circuits 6a, 6b, 12a, 12b, 13a, 13b are made conductive by the write signals CPUS, WRDA1 and WRDA2. The operation of this applied example is almost the same as Embodiment 1, but differs from Embodiment 1 in that digital value data latched by a register is supplied to the following register. In other words, the switch circuits 2a and 2b are first made conductive by the write signals WRDA1 and WRDA2, respectively, so that digital value data is input into the first registers (DA-1) 3a and (DA-2) 3b from the data bus 1. Thereafter, the switch circuits 6a and 6b are made conductive by the write signal CPUS so that digital value data latched by the first registers (DA-1) 3a and (DA-2) 3b are input simultaneously into the second registers (DA-1) 8a and (DA-2) 8b, respectively. The operation of this applied example thus far is the same as Embodiment 1. Then, the switch circuits 12a and 12b are made conductive by the write signals WRDA1 and WRDA2 so that the digital value data latched by the second registers (DA-1) 8a and (DA-2) 8b are input simultaneously into the third registers (DA-1) 9a and (DA-2) 9b, respectively. At this time, other digital value data is input into the first registers (DA-1) 3a and (DA-2) 3b from the data bus 1 by the write signals WRDA1 and WRDA2. Then, the switch circuits 13a and 13b are made conductive by the write signal CPUS so that the digital value data latched by the third registers (DA-1) 9a and (DA-2) 9b are input simultaneously into the fourth registers (DA-1) 10a and (DA-2) 10b, respectively. Then, the switch circuits 14a and 14b are made conductive by the write signal CPUS so that the digital value data are converted into analog voltages. The above applied example has been described based on Embodiment 1, but needless to say, it can also be applied in Embodiments 2 and 3.

Figure 8:
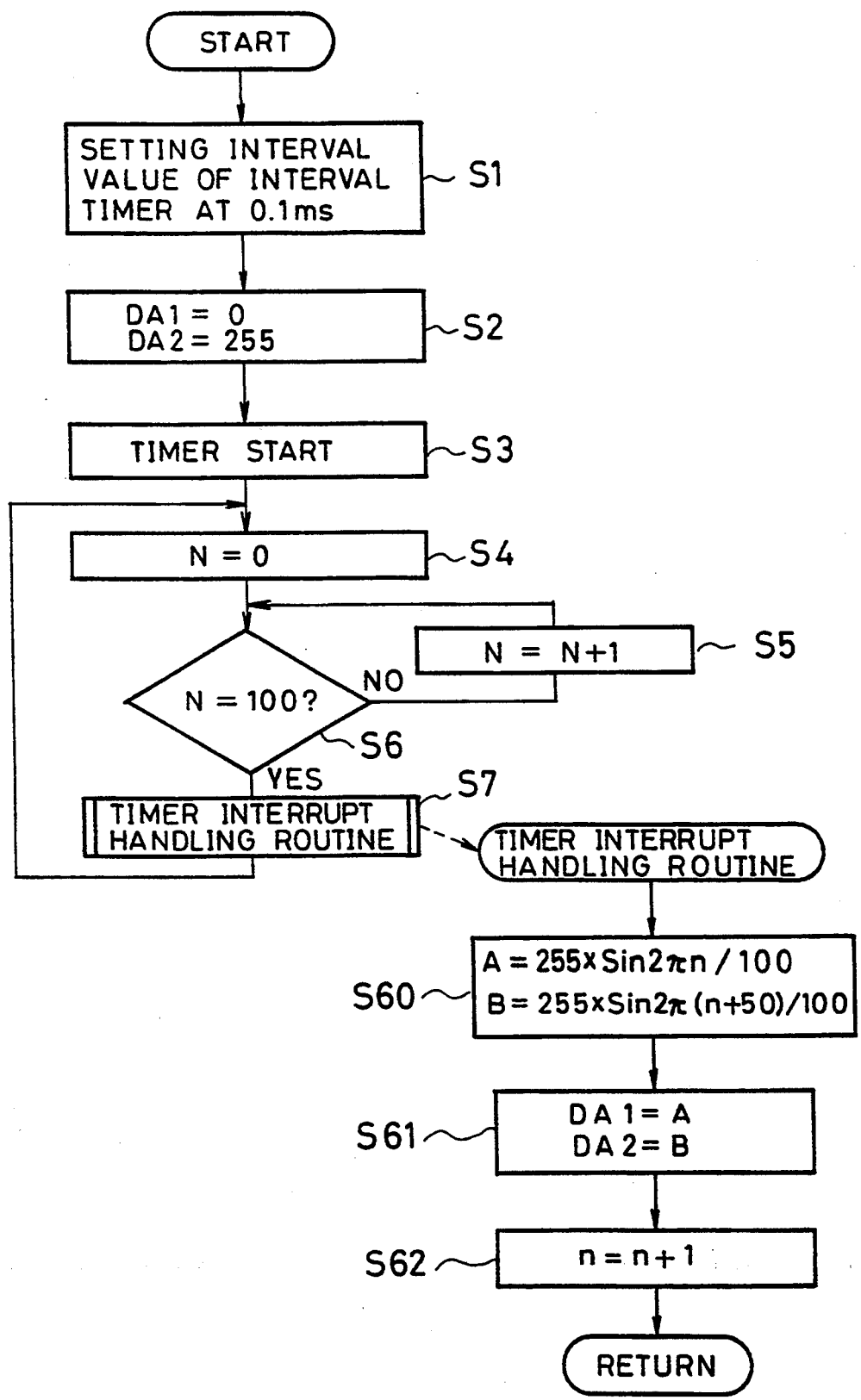
FIG. 8 is a flow chart illustrating an example of a program when the invention is used.
Figure 9:
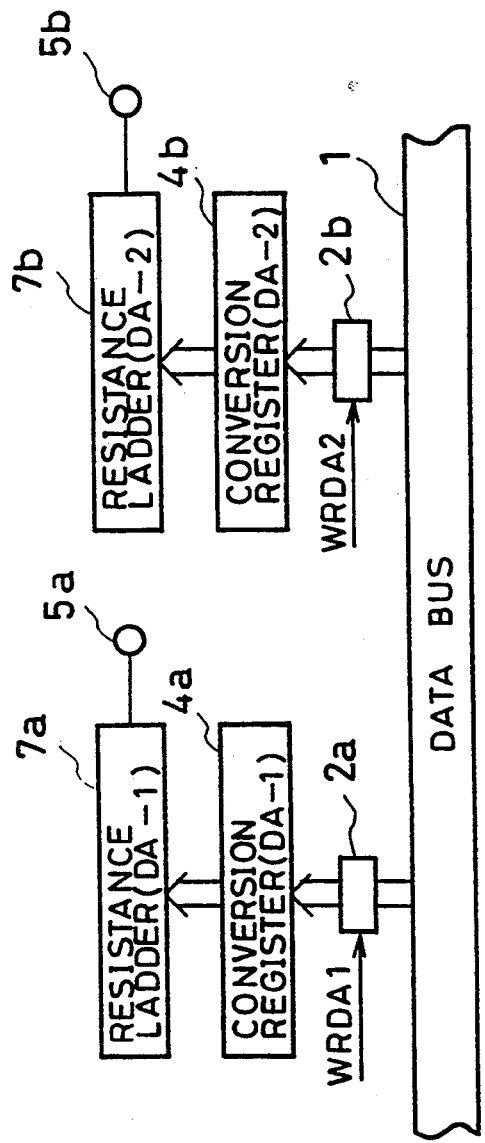
FIG. 9 is a circuit block diagram of a prior art D/A conversion device.

FIG. 8 is a flow chart of a timer type D/A conversion device of Embodiment 2 (as shown in FIG. 3) in which sine waves are output from the analog voltage output terminals 5a and 5b. Referring to this flow chart, the operation of the D/A conversion device will be described hereunder. The interval value of the timer circuit 30 (interval timer) is set at 0.1 ms (step S1), the initial value DA1 of a signal output from the analog voltage output terminal 5a is set at 0, and the initial value DA2 of a signal output from the analog voltage output terminal 5b is set at 255 (step S2). Then, the timer start signal is supplied from the central processing unit to the timer circuit 30. The timer circuit 30 begins to count from the initial count value N which is set at 0. After the timer circuit 30 has counted (N=N+1), the timer circuit 30 generates and sends the overflow signal TMOV to the switch circuits 6a and 6b (steps S4 to S6) when the count value becomes 100, that is, 0.1 ms. Then, a timer interrupt handling routine is performed (step S7), and the step goes back to S4. By repeating this process, the waves shown in FIG. 10 (Q) and (R) are output from the analog voltage output terminals 5a and 5b, respectively. The step S7 consists of steps S60 to 62.

As described above, according to this embodiment of the invention, analog voltages output from the analog voltage output terminals 5a and 5b can be changed simultaneously, whereby there is no need to take into consideration a phase difference. Furthermore, the central processing unit performs other functional calculi, whereby the analog output voltage waves of various functions can be output with simple control.

As described on the foregoing pages, according to the first aspect of the invention, since outputs from a plurality of D/A converters in the D/A conversion device can be changed simultaneously by specifying a predetermined address, a plurality of control objects can be controlled simultaneously. Also, the phase difference can be controlled with ease and the accuracy of the phase difference can be improved, which is especially useful in systems where phase differences have created problems. Furthermore, since the control can be performed with ease, the reliability of the entire system including the D/A converters can be enhanced.

According to the second aspect of the invention, since outputs from a plurality of D/A converters in the D/A conversion device can be changed simultaneously by the overflow signal from the timer circuit, a plurality of control objects can be controlled simultaneously independent from the central processing unit. This combined with the effect of the first aspect of the invention means that control can be effected with a simpler configuration than that of the first aspect of the invention.

According to the third aspect of the invention, since outputs from a plurality of D/A converters in the D/A conversion device can be changed simultaneously by the pulse signal from the external circuit, a plurality of control objects can be controlled simultaneously. This combined with the effects of the first aspect of the invention means that the circuit of a D/A conversion device connected to the external circuit for generating the pulse signal is realized with a simpler configuration than that of the first aspect of the invention.

What is claimed is:

1. A D/A conversion device comprising:
   a plurality of first switch circuits which, each time an address value is specified by a central processing unit, make conductive circuits specified by the address value to selectively pass a plurality of digital data values from a bus, a plurality of latch means corresponding to said first switch circuits for temporarily latching said plurality of digital data values, and a plurality of D/A converts for converting said plurality of digital data values from said first latch means into analog data values, wherein:
   the device further comprises a plurality of second latch means provided between said switch circuits and said first latch means for receiving and latching said plurality digital data values through said first switch circuits which become conductive, and a plurality of second switch circuits which become conductive simultaneously when an address value is specified by said central processing unit to transfer said plurality of digital data values latched by said second latch means to said respective first latch means wherein digital to analog conversion is done simultaneously for all of said plurality of digital data values.

2. The D/A conversion device according to claim 1 wherein said predetermined address value supplied to a plurality of said second switch circuits is a single signal.

3. The D/A conversion device according to claim 1 wherein a plurality of said D/A converters have the same D/A conversion function.

4. The D/A conversion device according to claim 1 which comprises a plurality of sets of said second switch circuits and said second latch means.

5. The D/A conversion device according to claim 4 wherein a plurality of said second switch circuits correspond to an address value specified by said central processing system and become conductive simultaneously when said address value is specified.

6. A D/A conversion device comprising:
   a plurality of first switch circuits which, each time an address value is specified by a central processing unit, make conductive circuits specified by the address value to selectively pass a plurality of digital data values from a bus, a plurality of latch means corresponding to said first switch circuits for temporarily latching said plurality of digital data values, and a plurality of D/A converters for converting said plurality of digital data values from said first latch means into analog data values, wherein:
   the device further comprises a plurality of second latch means provided between said switch circuits and said first latch means for receiving and latching said plurality of digital data values through said first switch circuits which become conductive, a timer circuit for outputting an overflow signal at predetermined time intervals, and a plurality of second switch circuits which become conductive simultaneously upon reception of the overflow signal from said timer circuit to transfer said plurality of digital data values latched by said second latch means to said respective first latch means wherein digital to analog conversion is done simultaneously for all of said plurality of digital data values.

7. The D/A converter according to claim 6 wherein said timer circuit is caused by said central processing unit to begin to count.

8. A D/A conversion device comprising a plurality of first switch circuits which, each time an address value is specified by a central processing unit, make conductive circuits specified by the address value to selectively pass a plurality of digital data values from a bus, a plurality of latch means corresponding to said first switch circuits for temporarily latching said plurality of digital data values, and a plurality of D/A converters for converting said plurality of digital data values from said first latch means into analog value data, wherein:
   the device further comprises a plurality of second latch means provided between said switch circuits and said first latch means for receiving and latching said plurality of digital data values through said first switch circuits which become conductive, an edge detection circuit for detecting an edge from a rise or fall in external input signal input from an external circuit, and a plurality of second switch circuits which become conductive simultaneously upon reception of the signal from said edge detection circuit to transfer said plurality of digital data values latched by said second latch means to said respective first latch means wherein digital to analog conversion is done simultaneously for all of said plurality of digital data values.

* * * * *